United States Patent [19]

Kremer

[11] 3,997,888
[45] Dec. 14, 1976

[54] CHARGE MONITOR FOR ELECTRIC BATTERY

[75] Inventor: Manfred Kremer, Hamburg, Germany

[73] Assignee: Still GmbH (vormals SE-Fahrzeugwerke GmbH), Hamburg, Germany

[22] Filed: Oct. 2, 1975

[21] Appl. No.: 618,922

[30] Foreign Application Priority Data

Oct. 2, 1974 Germany .......................... 2446958

[52] U.S. Cl. ................................ 340/249; 320/48; 324/29.5
[51] Int. Cl.² ........................................ G08B 21/00
[58] Field of Search ........... 340/249, 248 B, 253 C; 324/29.5; 320/48; 307/10 BP

[56] References Cited

UNITED STATES PATENTS

| | | | |
|---|---|---|---|
| 3,447,060 | 5/1969 | Tedd | 340/249 X |
| 3,475,061 | 10/1969 | Steinkamp et al. | 340/249 X |
| 3,529,230 | 9/1970 | Tedd | 320/48 |
| 3,568,175 | 3/1971 | Schwehr et al. | 340/249 |
| 3,576,488 | 4/1971 | Zug et al. | 320/48 |
| 3,676,770 | 7/1972 | Sharaf et al. | 324/29.5 |
| 3,786,342 | 1/1974 | Molyneux | 324/29.5 |
| 3,898,548 | 8/1975 | Perelle et al. | 320/48 |
| 3,900,831 | 8/1975 | Houseman et al. | 340/249 X |
| 3,932,797 | 1/1976 | York | 320/48 |
| 3,934,188 | 1/1976 | York | 320/48 |

*Primary Examiner*—John W. Caldwell
*Assistant Examiner*—Daniel Myer
*Attorney, Agent, or Firm*—Karl F. Ross; Herbert Dubno

[57] ABSTRACT

An electric battery, such as that of an automotive vehicle, is continuously tested for its state of charge by a bridge circuit in parallel with a voltage stabilizer such as a Zener diode which forms part of a voltage divider connected across the battery terminals, the other part of that divider being a resistance circuit. The bridge circuit has an output diagonal with one corner connected to the battery terminal which is tied to the resistance circuit so that a reduction of battery voltage unbalances the bridge in one sense, a compensatory change in the opposite sense being brought about by a sensor responsive to the load current drawn from the battery. The current sensor may be a small resistor inserted between two adjoining bridge arms. An integrating operational amplifier connected across the output diagonal of the bridge controls a pulse generator which steps an associated pulse counter whenever the amplifier output passes a threshold indicating a predetermined degree of depletion of the battery; the counter, after measuring a cumulative time interval during which this depletion condition is present, triggers a switch which generates an alarm signal, e.g. by eliminating certain options in the operation of the vehicle. The operational amplifier and/or pulse generator also work into visual charge indicators. The resistance circuit of the voltage divider may include a transistor designed to compensate changes in battery current due to the de-energization of a switching relay. A feedback connection between the counter and the pulse generator causes continuing stepping of the counter after the switchover to maintain the alarm signal until the counter resets itself after an extended period, such resetting also occurring upon reclosure of the load circuit after a prolonged interruption.

19 Claims, 3 Drawing Figures

CHARGE MONITOR FOR ELECTRIC BATTERY

FIELD OF THE INVENTION

My present invention relates to a system for and a method of monitoring the state of charge of an electric battery, especially — though not exclusively — one supplying power to an automotive vehicle for driving same and, possibly, for controlling ancillary devices thereon such as, for example, a hydraulic lifting mechanism of a self-propelled fork-lift truck.

BACKGROUND OF THE INVENTION

If a vehicular or other rechargeable battery is discharged beyond a certain state of depletion, it may be irreversibly overloaded and thus permanently disabled. In systems operating without charger, or even in charger-equipped vehicles where a faulty charger can cause great inconvenience, it is therefore desirable to monitor the state of charge of such a battery in order that the same may be recharged or, if need be, replaced in time.

To determine the state of charge of a battery in use, it is not sufficient to measure its terminal voltage since that voltage varies with the current drawn by the load. It is therefore necessary to derive a test parameter from simultaneous measurements of voltage and current with establishment of an alarm condition (e.g. the emission of a visual signal) by the measuring instrument upon ascertainment of a certain degree of depletion — say, a discharge of 80% — to warn the operator, usually with a certain delay in order to exclude transient conditions.

Instruments heretofore used for this purpose include rotary-coil galvanometers connected across a resistor lying in series with the load. In a moving vehicle, such galvanometers must be relatively insensitive to vibrations and therefore require a substantial input voltage for their operation so that the resistor must be of appreciable magnitude; such a series register, of course, dissipates considerable energy on being traversed by the load current. Thus, an accurate charge indication is difficult to obtain with conventional apparatus of this type.

OBJECTS OF THE INVENTION

An important object of my present invention, therefore, is to provide an improved charge monitor effective during the use of a battery, e.g. on a moving object such as an electrically operated carriage, to signal in a reliable manner the approaching depletion of that battery.

Another object is to provide a compact structural arrangement for accommodating such a charge monitor in a limited space, e.g. on a self-propelled fork-lift truck.

It is also an object of my invention to provide a method of and means for monitoring the state of charge of such a battery with automatic changeover to a condition reducing the rate of energy consumption.

SUMMARY OF THE INVENTION

In accordance with my present invention, a voltage divider connected across a first and a second terminal of a battery to be monitored has a voltage-stabilized first section and a resistive second section in series, a resistive bridge circuit being connected across the first divider section between the first terminal and the junction point of these sections while a resistive connection extends from the second terminal to a corner of an output diagonal of the bridge so as to tend to unbalance same in a certain sense upon a decrease of the battery voltage, i.e. of the potential difference between the two terminals. A current sensor couples the bridge with the load circuit in a manner tending to unbalance the bridge in the opposite sense for an increase in the flow of load current, thereby compensating for the reduction in terminal voltage due to such current flow. An amplifier, preferably of the integrating operational type, is differentially connected across the output diagonal of the bridge to generate a test voltage representative of the state of charge of the battery; a detector circuit connected to this amplifier establishes an alarm condition whenever this test voltage passes from a normal range to an off-normal range indicative of a predetermined state of depletion.

The current sensor may comprise a resistor in series with the load inserted between two adjoining bridge arms; the magnitude of this resistor can be very small compared with that of these bridge arms and the other bridge resistances inasmuch as the voltage drop thereacross is magnified by the operational magnifier. It should be noted, however, that other types of low-dissipation sensors (e.g. electromagnetic or thermal) responsive to the load current could also be used.

In a particularly advantageous embodiment, this amall series resistor and minor parts of the adjoining bridge arms — of comparable resistance — are constituted by a metal plate physically supporting other major components of the system, such as the remainder of the bridge circuit, the operational amplifier and the associated detector circuit.

According to a more specific feature of my invention, the detector circuit comprises timing means activated by the output of a comparator whenever the test voltage lies in its off-normal range, as determined by a reference voltage obtained from a potentiometer connected in parallel with the bridge circuit. A switching transistor or equivalent switchover means is reversed by the timing means upon the elapse of a predetermined cumulative duration of the times of activation thereof by the comparator output. I prefer to use as the timing means a pulse generator working into a pulse counter adapted to store the number of pulses previously generated even if successive periods of activation are separated by prolonged recovery intervals in which the test voltage falls into the normal range.

It is, of course, desirable not to preserve such a count over an extended standstill period during which the battery may have been recharged or replaced, or may have recovered sufficiently to be again suitable for longer use. On the other hand, short-term interruptions of the load circuit should not have the effect of cancelling the information registered in the counter. Thus, according to a further feature of my invention, the counter may have a resetting input connected to a reactive branch of the load circuit to restore the count to zero upon closure of that circuit, this reactive branch including capacitive storage means for preventing such restoration in the case of a reclosure following an interruption for less than a predetermined minimum interval.

It could happen, though, that a battery is being charged without disconnection from the load. In order to obviate the need of breaking the load circuit under such circumstances for an extended period, I prefer to provide the pulse generator with a feedback connection from the switchover means for continuing the stepping of the counter in the alarm condition, independently of the voltage comparator, until another predetermined count is reached which causes restoration of the switchover means to its former, normal state.

There are various ways in which the alarm condition can be brought to the attention of an operator, aside from the operation of visual indicators such as voltmeters and light emitters. A particularly effective method is a switching operation which eliminates certain options in the operation of the load, e.g. by cutting off the power to at least a significant part thereof, since this not only gives a signal but automatically reduces or stops the power consumption so as to retard or prevent complete exhaustion of the battery. In a fork-lift truck, for example, the cutoff may be limited to the controls for the (usually hydraulic) lifting mechanism while the traction-wheel drive remains energized; simultaneously, or alternatively, the drive circuit may be modified to permit only low-speed locomotion for letting the vehicle travel to the nearest charging station.

BRIEF DESCRIPTION OF THE DRAWING

The above and other features of my invention will now be described in detail with reference to the accompanying drawing in which.

SPECIFIC DESCRIPTION

Figure 1:
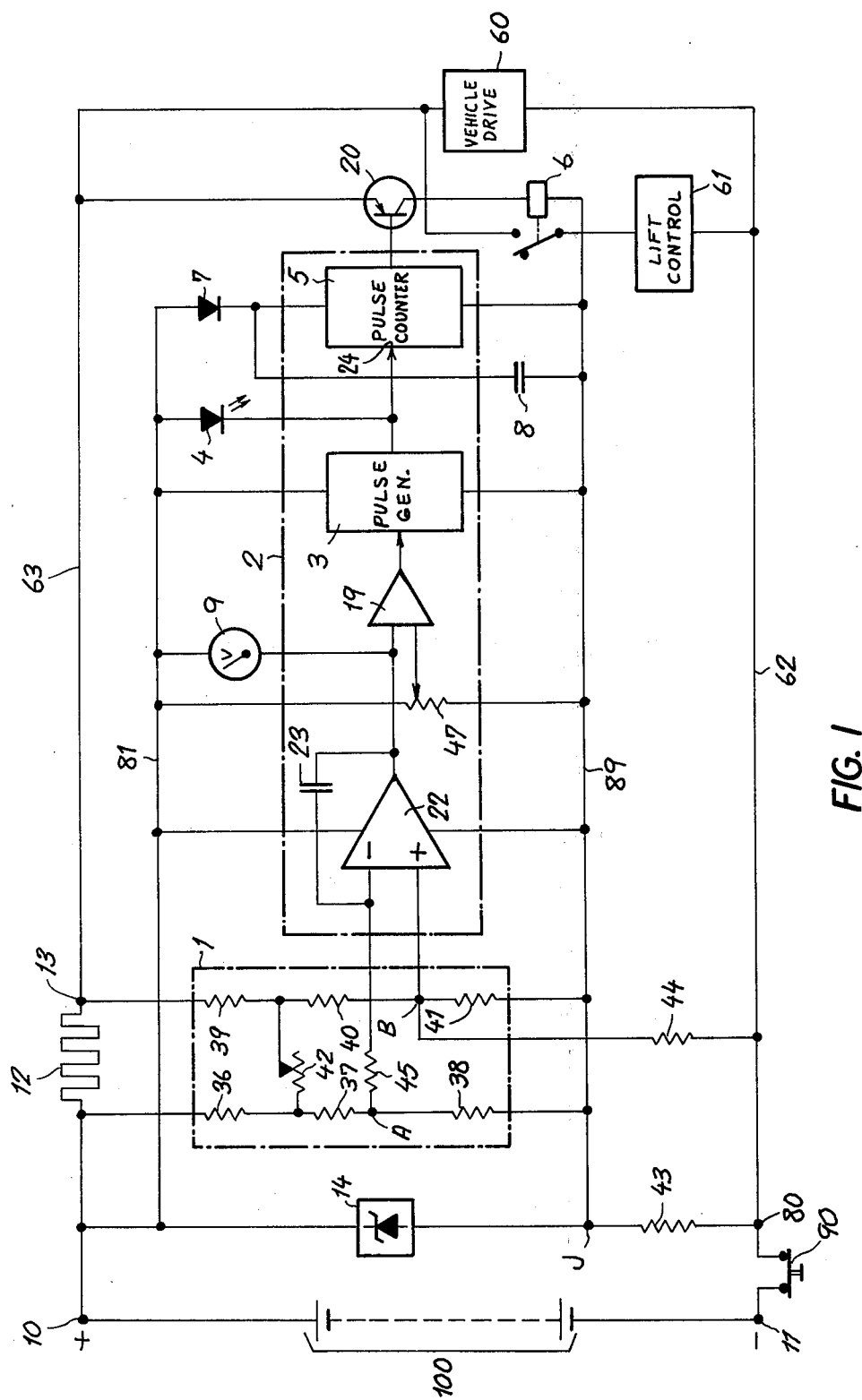
FIG. 1 is a block diagram of a charge monitor embodying the present invention.
Figure 2:
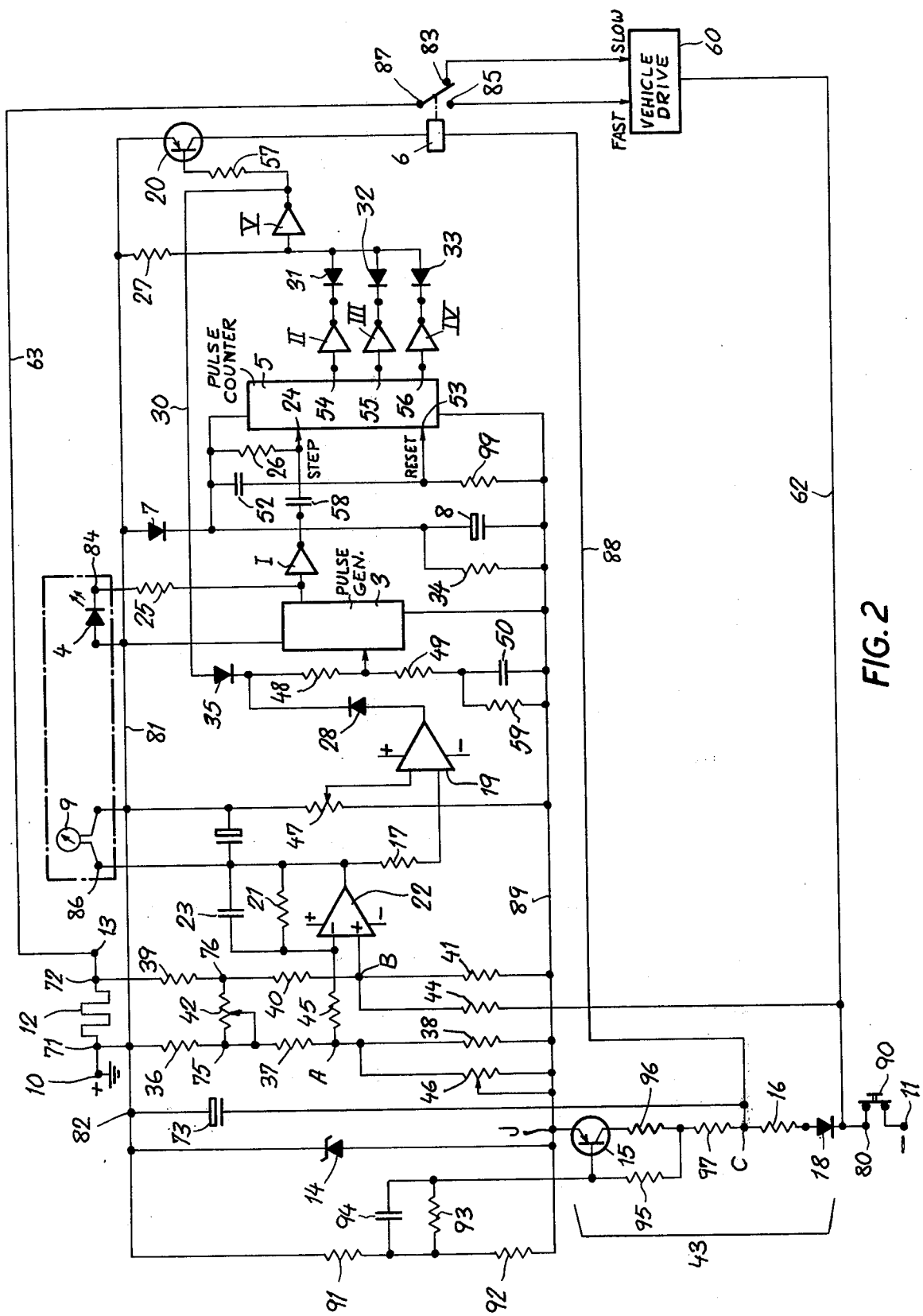
FIG. 2 is a more detailed circuit diagram, illustrating certain modifications.

In FIG. 1 I have shown a rechargeable battery 100 in series with a master switch 90, the battery having a first, positive terminal 10 and a second, negative terminal 11 connected to respective bus bars 81, 62. One of these terminals, generally the positive one in accordance with the usual practice, may be grounded as indicated in FIG. 2.

A voltage divider connected across battery 100 comprises a constant-voltage section, represented by a Zener diode 14, in series with a resistive section 43 illustrated in FIG. 1 as a simple resistor. The junction point J of these two divider sections is tied to an ancillary bus bar 89. Closure of master switch 90 completes a load circuit from terminal 10 via a low-ohmic resistor 12, a conductor 63, a load 60 here assumed to be an electric motor driving a self-propelled fork-lift truck, and bus bar 62 to a point 80 connected by a switch 90 to terminal 11. An ancillary load 61, i.e. a control circuit for a hydraulic lifting mechanism of the fork-lift truck, is connected in parallel with the main load 60 via an armature and a front contact of an electromagnetic relay 6 whose winding, in series with a switching transistor 20 of PNP type, is connected in FIG. 1 between conductor 63 and bus bar 89; in FIG. 2 the relay and the transistor lie between bus bars 81 and 89. Relay 6 is energized in the normal operation of the system as more fully described hereinafter.

A resistance bridge 1 is connected in parallel with Zener diode 14 between terminal 10 and ancillary bus bar 89. The bridge has a first arm consisting of two series resistors 36, 37 inserted between battery terminal 10 and a corner A of an output diagonal, a second arm consisting of two series resistors 39, 40 inserted between a point 13 at the opposite end of resistor 12 and another corner B of that diagonal, a third arm in the form of a resistor 38 between points J and A, and a fourth arm in the form of a resistor 41 between points J and B. A variable resitor 42 is connected between the junctions of resistor pairs 36, 37 and 39, 40 in order to adapt the bridge circuit 1 to the characteristics of the battery 100. The voltage drop across Zener diode 14, necessarily smaller than the battery voltage of nominally 12 V, for example, may be about 10 V.

Bridge corner B is further connected to negative bus bar 62 via a resistor 44 so dimensioned, along with the several bridge resistances, that point B is always positive with reference to point A even when there is a maximum voltage drop across resistor 43 (battery fully charged, no load current) or across resistor 12 (maximum load current). It will be understood that the lowering of the potential of point B by the load current is to compensate, as exactly as possible, the raising of that potential by the decrease in the voltage drop across resistor 43 which results from the reduction in the terminal voltage due to the internal resistance of the battery.

An operational amplifier 22, with an integrating capacitor 23 inserted between its output and its inverting input in parallel with a resistor 21 (FIG. 2), has that inverting input connected via a resistor 45 to point A and has its noninverting input connected to point B. As long as the battery 100 holds an effective charge, the voltage difference between points A and B is small and a test voltage in the output of amplifier 22 is less than a reference voltage on a tap of potentiometer 47 bridged across bus bars 81 and 89. The test voltage from amplifier 22 and the reference voltage from potentiometer 47 are applied to respective inputs of a comparator 19, the test voltage being also fed to a voltmeter 9 inserted between the amplifier output and bus bar 81. The pointer of the voltmeter 9 stands on a green field as long as the test voltage is in a normal range indicative of this state of charge; the output of comparator 19 is low (L), e.g. 2.5 V above the potential of bus bar 89. A pulse generator 3, with an activating input connected to the comparator output, is inoperative under these circumstances. Pulse generator 3 works into a stepping input 24 of a pulse counter 5 and, in parallel therewith, into a light-emitting diode 4 inserted between its output and bus bar 82. Amplifier 22, generator 3 and counter 5 form part of a detecting network 2 whose components are all energized from bus bars 81 and 89; the positive supply lead of pulse counter 5 includes a diode 7 in series with a capacitor 8, connected to bus bar 89, for a purpose which will be explained hereinafter with reference to FIG. 2.

Pulse counter 5 has a stage output connected to the base of switching transistor 20. When the counter is reset, as likewise described below, that output is at a relatively negative potential (L) so that transistor 20 conducts and energizes the relay 6, thereby completing the operating circuit for ancillary load 61. The light-emitting diode 4 is not energized.

When, with increasing depletion of battery 100, the potential of point B rises with reference to that of point A, comparator 19 eventually switches to a high output (H) — e.g. of 8.5 V with reference to the potential of bus bar 89 — as the test voltage in the output of amplifier 22 reaches the magnitude of the reference voltage on the tap of potentiometer 47. Pulse generator 3 now operates and emits a train of negative pulses which cause the diode to flash, at a rate well within the range of visual perception such as 1.5 Hz. Pulse counter 5 is stepped at the same rate but does not block the switching transistor 20 until its count has reached a value energizing the corresponding stage output, i.e. driving the potential of that output more positive. When this occurs relay 6 releases its armature and load 61 is cut off.

When the test voltage in the output of amplifier 22 rises into the off-normal range, the pointer of voltmeter 9 stands on a red field and indicates the extent of the depletion while the operator's attention is called to this situation by the flashing of LED 4. If the operator now briefly opens the master switch 90, the battery 100 may recover sufficiently to return the pointer to the green field upon subsequent reclosure of the load circuit, with pulse generator 3 remaining inactive. The count previously registered in component 5, indicative of the length of time during which the test voltage was off-normal, is preserved, however, and is increased whenever the pulse generator is reactivated.

Since in FIG.1 the operating current for relay 6 passes through the sensing resistor 12, the cessation of that current upon cutoff of transistor 20 does not alter the input voltages of amplifier 22 inasmuch as the reduced voltage drop across this resistor is compensated by the resulting increase in terminal voltage as discussed above. In FIG. 2, however, I have shown the emitter of transistor 20 connected to bus bar 81 instead of conductor 63 so that such compensation does not occur; I have therefore included in divider section 43 a compensating PNP transistor 15 whose emitter is tied to bus bar 89 and whose collector is connected to point 80 on negative bus bar 62 by way of series resistors 96, 97 and 16 as well as a diode 18 which protects the transistor 15 against accidental polarity reversals in the connection of the battery to the monitoring system. An integrating network in parallel with Zener diode 14 includes a voltage divider formed by two resistors 91, 92 and a further resistor 93 lying between the junction of these two resistors and the base of transistor 15, resistor 93 being shunted by a capacitor 94. Another resistor 95 is inserted between the transistor base and the junction of collector resistors 96 and 97. The winding of relay 6, which in FIG. 1 is shown tied to bus bar 89, is here connected by way of a conductor 88 to the junction C of resistors 16 and 97 so that the relay current flows only through the latter resistor; when that current stops, point C goes more negative and lowers the resistance of transistor 15 so that more current is drawn from the battery through the voltage divider 14, 43 whereby the terminal voltage of the battery is left substantially unchanged by the switchover. By the same token, a subsequent re-energization of relay 6 (as described below) will not significantly reduce that terminal voltage and will not cause an added drain of the battery.

In FIG. 2 I have further shown a calibrating resistor 46 connected in parallel with resistor 38 as part of the third bridge arm. A capacitor 73 between conductors 81 and 88 protects the transistor 15 against transient peak voltages. A resistor 17 is shown inserted between the output of amplifier 22 and the corresponding input of comparator 19. The output of pulse generator 3 is connected to stepping input 24 of counter 5 via an inverter I in series with a capacitor 58, this output being joined to the cathode of LED 4 by way of another resistor 25. Capacitor 8 lies in parallel with a discharge resistor 34 and with a differentiation circuit consisting of a capacitor 52 in series with a resistor 99, their junction being tied to a reset input 53 of counter 5. This counter has three stage outputs 54, 55, 56 connected via respective inverters II, III, IV and diodes 31, 32, 33 to the input of a further inverter V and in parallel therewith through a resistor 27 to bus bar 81. Inverter V biases the base of switching transistor 20 via a resistor 57 and is further connected by way of a feedback lead 30 and a diode 35 to a capacitor 50, joined to bus bar 89, through two series resistors 48, 49 whose junction is tied to the activating input of pulse generator 3. The output of comparator 19 is connected via a diode 28 to the junction of diode 35 with resistor 48. A discharge resistor for capacitor 50 is shown at 59.

Capacitor 50 and resistor 59 delay the effect of a change in the output of comparator 19 so as to prevent brief voltage fluctuations from affecting the pulse generator 3. Storage network 8, 34 has a time constant sufficient to disable the differentiation circuit 52, 99 for, say, two minutes by keeping its capacitor 52 charged during short-term interruptions of the load circuit. When that load circuit is completed by closure of master switch 90 after having been interrupted for a longer period, negative voltage on bus bar 89 energizes the resetting input 53 of counter 5 which is thereby restored to zero, de-energizing its stage outputs 54–56 and driving the outputs of inverters II–IV positive so that a blocking potential is applied to diodes 31–33. The full positive potential of bus bar 82 is thus transmitted by resistor 27 to the input of inverter V whose output, accordingly, is low and, through resistor 57, unblocks the transistor 20 with resulting energization of relay 6. Capacitors 8 and 50 are both discharged at this time.

When comparator 19 responds to an off-normal test voltage in the output of amplifier 22, pulse generator 3 is activated with a delay determined by network 50, 59 and emits negative pulses which, besides causing the LED 4 to flash, pass through inverter I and capacitor 58 to stepping input 24 so that counter 5 is advanced and, eventually, energizes its output 54 which may be that of its $10^{th}$ stage, loaded after $2^9 = 512$ pulses. With the aforementioned pulse cadence of 1.5 Hz this represents a cumulative off-normal period of about 5½ minutes. Outputs 55 and 56, which may be those of the $11^{th}$ and $12^{th}$ stages, are subsequently energized. The corresponding diodes 31–33 are thereby made conductive and inverter V acquires a highly positive output, blocking the transistor 20 and feeding back charging voltage by way of lead 30 and diode 35 as well as resistors 48 and 49 to capacitor 50 so as to keep the pulse generator 3 operating regardless of possible reversions of the output voltage of comparator 19 to its low state. This situation lasts until the counter 5 has reached the end of its capacity after $2^{12} = 4096$ pulses, or approximately 45 minutes. The counter then returns to zero and switching transistor 20 conducts again, thereby re-energizing the relay 6.

In FIG. 2 the relay 6 is shown to have an armature 87, connected to conductor 63, with a back contact 83 tied to a "slow" input of vehicle drive 60 and a front contact 85 tied to a "fast" input thereof. Thus, energization of the relay permits the operator to drive the fork-lift truck or other vehicle at high speeds whereas its release allows the use of low speeds only.

Figure 3:
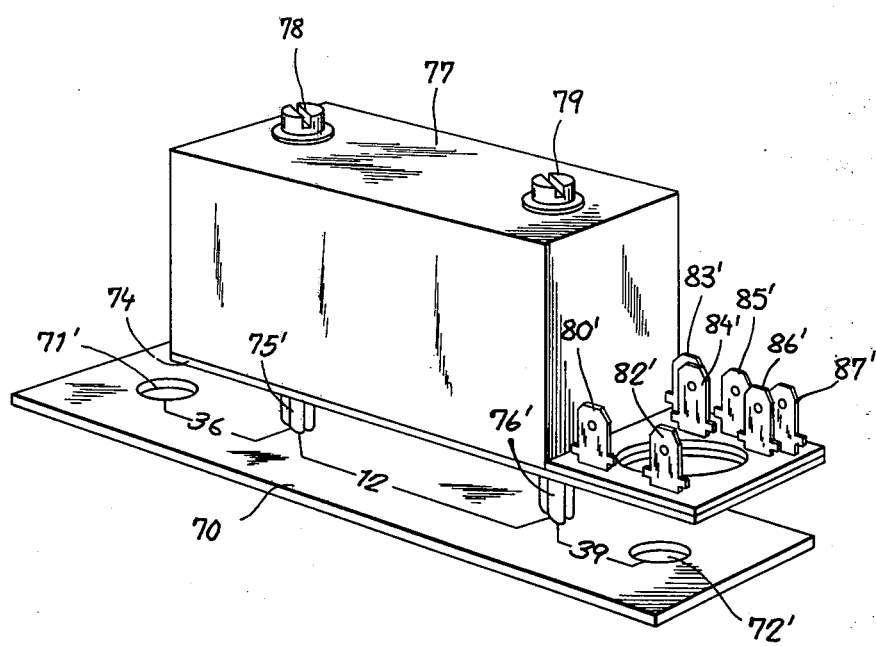
FIG. 3 is a perspective view of a physical unit incorporating most of the components shown in FIG. 2.

In FIG. 3 I have illustrated a metallic base plate 70 supporting, by a pair of metal sleeves 75', 76', a bottom plate 74 of a switch housing 77 accomodating the relay 6 and other parts of the system shown in FIG. 2, bottom plate 74 carrying a printed circuit. Housing 77 is secured to base plate 70 by screws 78, 79 threaded into sleeves 75', 76', the latter representing the junctions between resistors 36, 37 and 39, 40 designated 75 and 76 in FIG. 2. Holes 71' and 72' of plate 70 receive nonillustrated connectors representing junction points 71 and 72 in FIG. 2 between resistors 12 and 36, 39. These low-ohmic resistors are constituted in FIG. 3 by respective sections of base plate 70 lying between holes 71', 72' and sleeves 75', 76'. Tabs 80' and 82' – 87' on bottom plate 74 represent analogously designated points in FIG. 2, i.e. terminal 80 of bus bar 62, a point 82 on bus bar 81, back contact 83, a terminal 84 of LED 4, front contact 85, a terminal 86 of voltmeter 9, and the anchor point of armature 87. According to the showing of FIG. 2, tab 82' and the connector 71' may be grounded.

Thus, the unit shown in FIG. 3 can be readily connected to all external circuit elements including the battery, the visual indicators 4 and 9, and the load.

I claim:

1. A charge monitor for an electric battery provided with a first and a second terminal and with a load circuit connected across said terminals, comprising:
    a voltage divider with a voltage-stabilized first section and a resistive second section serially connected across said terminals, said first section extending between said first terminal and a juction point, said second section extending between said junction point and said second terminal;
    a resistive bridge circuit connected between said first terminal and said junction point, said bridge circuit having an output diagonal with a corner tied to said second terminal via a resistive connection for tending to unbalance said bridge circuit in one sense upon a decrease in the potential difference between said terminals;
    current-sensing means coupling said bridge circuit with said load circuit for tending to unbalance said bridge circuit in an opposite sense upon an increase in current flow through said load circuit;
    amplifier means differentially connected across said output diagonal for generating a test voltage representative of the state of charge of said battery; and
    dectector means connected to said amplifier means for establishing an alarm condition upon said test voltage passing from a normal range to an off-normal range indicative of a predetermined state of depletion of said battery.

2. A charge monitor as defined in claim 1 wherein said current-sensing means comprises a series resistor in said load circuit inserted between two adjoining arms of said bridge circuit, said arms having resistances substantially exceeding that of said series resistor.

3. A charge monitor as defined in claim 2 wherein said adjoining arms are provided with adjustable resistance means for modifying the balance of said bridge circuit.

4. A charge monitor as defined in claim 2 wherein said series resistor and minor parts of said adjoining arms are constituted by a metal plate physically supporting the remainder of said bridge circuit, said amplifier means and said detector means.

5. A charge monitor as defined in claim 1 wherein said detector means comprises a comparator with inputs respectively connected to said amplifier means and to a source of reference voltage.

6. A charge monitor as defined in claim 5 wherein said source of reference voltage comprises a potentiometer connected across said first terminal and said junction point in parallel with said bridge circuit.

7. A charge monitor as defined in claim 5 wherein said dectector means further comprises timing means having a control input connected to said comparator for activation thereby whenever said test voltage lies in said off-normal range, and switchover means reversible by said timing means into an off-normal state upon the elapse of a predetermined cumulative duration of said activation.

8. A charge monitor as defined in claim 7 wherein said timing means comprises a pulse generator provided with said control input and a pulse counter connected to said pulse generator for stepping thereby, said pulse counter having at least one stage output connected to said switchover means for operating same upon attainment of a predetermined count.

9. A charge monitor as defined in claim 8 wherein said pulse counter is provided with a resetting input connected to a reactive branch of said load circuit for energization upon closure of said load circuit.

10. A charge monitor as defined in claim 9, further comprising capacitive storage means in said reactive branch for preventing resetting of said pulse counter by reclosure of said load circuit following an interruption thereof for less than a predetermined minimum interval.

11. A charge monitor as defined in claim 8 wherein said pulse generator is provided with a feedback connection from said switchover means for continuing the stepping of said pulse counter in said alarm condition, independently of said comparator, to another predetermined count resulting in restoration of said switchover means to a normal state.

12. A charge monitor as defined in claim 8, further comprising a visual indicator connected to said pulse counter in parallel with said pulse generator for intermittent actuation thereby.

13. A charge monitor as defined in claim 12 wherein said visual indicator is a light-emitting diode.

14. A charge monitor as defined in claim 7 wherein said switchover means comprises a switching transistor in series with an electromagnetic relay connected across said terminals via at least a portion of said second section of said voltage divider.

15. A charge monitor as defined in claim 14 wherein said second section includes transistor means connected in series with said portion for substantially compensating the change in battery current due to energization and de-energization of said relay.

16. A charge monitor as defined in claim 14 wherein said load circuit supplies power to an automotive vehicle, said relay having contacts for limiting the power supplies in said alarm condition.

17. A charge monitor as defined in claim 16 wherein said automotive vehicle is equipped with electric drive means and with an electrically controlled lifting mechanism, said contacts preventing the energization of said lifting mechanism in said alarm condition.

18. The combination defined in claim 1 wherein said amplifier means comprises an integrating operational amplifier.

19. The combination defined in claim 18, further comprising voltage-measuring means connected to said operational amplifier in parallel with said detector means.

* * * * *